United States Patent [19]

Tuccu

[11] 3,989,957

[45] Nov. 2, 1976

[54] COUNT-OF-TEN SEMICONDUCTOR STRUCTURE

[75] Inventor: Patrick A. Tuccu, Cupertino, Calif.

[73] Assignee: Signetics Corporation, Sunnyvale, Calif.

[22] Filed: Oct. 31, 1975

[21] Appl. No.: 627,554

[52] U.S. Cl. .............................. 307/226 R; 307/215; 307/303; 307/299 B
[51] Int. Cl.² .................. H03K 21/06; H03K 23/30
[58] Field of Search ............... 307/226 R, 215, 303, 307/299 B

[56] References Cited
UNITED STATES PATENTS

| | | | |
|---|---|---|---|
| 3,264,567 | 8/1966 | Prieto | 307/226 X |
| 3,323,067 | 5/1967 | Eckl | 307/226 X |
| 3,562,654 | 2/1971 | Conant | 307/226 X |

OTHER PUBLICATIONS

Control & Information 11/1972 vol. 4, No. 10, "A Versatile Quad Decade Counter on an Mos Single Chip," by Watson.

Primary Examiner—John S. Heyman
Attorney, Agent, or Firm—C. Richard Pfeiffer; William H. Dana

[57] ABSTRACT

A count of ten divider uses plural divide-by-two circuits, plural NOR gates and an inverter formed in a semiconductor body all of the foregoing being in a collector-up configuration.

3 Claims, 7 Drawing Figures 3,989,957

COUNT-OF-TEN SEMICONDUCTOR STRUCTURE

BACKGROUND OF THE INVENTION

This invention relates generally to a bipolar semiconductor switching structure and a method of operation. More particularly, this invention relates to a bipolar semiconductor switching structure combining plural logic circuit functions and requiring extremely low operational power requirements.

Although bipolar divider logic structures have heretofore been provided, such structures have generally occupied excessive semiconductor area, require a large number of semiconductor regions and have relatively high power consumption. Thus there is a need for a high performance semiconductor divider structure.

OBJECTS AND SUMMARY OF THE INVENTION

Accordingly, it is a general object of the present invention to provide an improved performance, integrated semiconductor divider structure which operates at reduced power levels.

It is a particular object of the present invention to provide an improved semiconductor divider structure having reduced numbers of semiconductor regions and which may be formed in relatively high density arrays.

It is a further particular object of the present invention to provide a greatly simplified semiconductor structure and method for performing divider operations.

The foregoing and other objects of the invention are achieved in a semiconductor structure, and method of operation, utilizing plural divide-by-two circuits, plural NOR gates and an inverter. The semiconductor divider structure includes a semiconductor body, first, second, third and fourth divide-by-two logic circuits formed in said body, first, second, third and fourth NOR gates formed in said body, an inverter formed in said body and lead means for connecting said divide-by-two circuits said NOR gates and said inverter as a count of ten divider structure. Each of said divide-by-two logic circuits include four NOR gates connected as cross-coupled latches.

DETAILED DESCRIPTION OF THE PREFERRED EMBODIMENT

Figure 1:
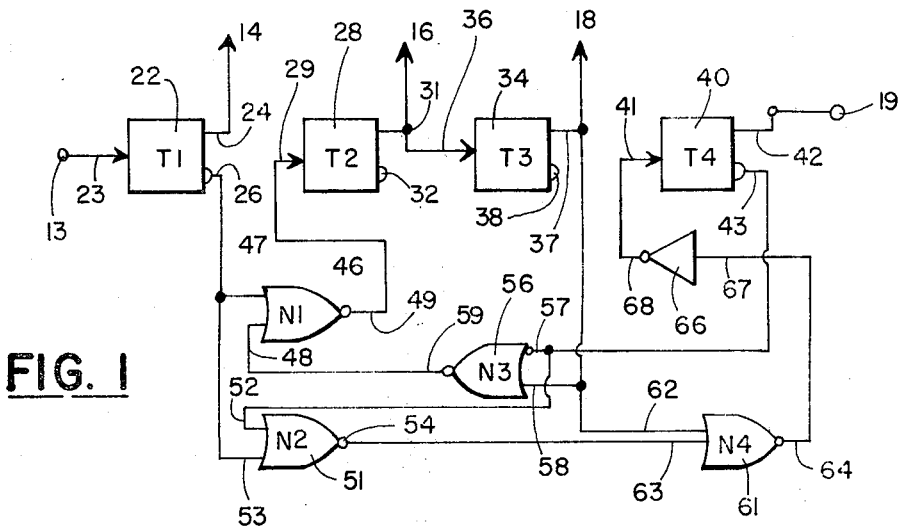
FIG. 1 is a symbolic logic diagram showing the interconnection of the logic blocs in the present invention.

Referring to FIG. 1 the symbolic block diagram of the present invention is shown including plural logic block elements. A signal input terminal 13 and a divide-by-ten output terminal 19 are provided. Intermediate terminals 14, 16 and 18 may be provided as desired to provide respective divide-by-two outputs. The divider includes first, second, third and fourth NOR gates 46, 51, and 61 also designated N1-N4 and divide-by-two blocks 22, 28, 34, 40 (T1–T4). An inverter 66 is also provided. First divide-by-two block 22 has a signal input terminal 23 connected to divider input 13, a signal output terminal 24 connected to terminal 14 and a signal complement output terminal 26 which is connected to the first terminal 47 of NOR gate 46 and the second terminal 53 of NOR gate 51. The output terminal 49 of gate 46 is connected to the input terminal 29 of divide-by-two block 28. The signal output of divide-by-two block 28 is connected to output terminal 16 and is also connected to the input terminal 36 of divide-by-two block 34. The signal complement outputs 32 and 38 of blocks 28 and 34 are not utilized. The signal output of block 34 is connected to output terminal 18 and to the second input terminal 58 of NOR gate 56 and the first input terminal 62 of NOR gate 61. The output terminal 64 of gate 61 is connected to the input terminal 67 of inverter 66 and the output terminal 68 of inverter 66 is connected to the input terminal 41 of divide-by-two block 40. The signal output terminal 42 of block 40 is connected to output terminal 19 and the signal complement output terminal 43 of block 40 is connected to the first input terminal 57 of gate 56 and the first input terminal 52 of gate 51. The output terminal 59 of gate 56 is connected to the second input terminal 48 of gate 46. The output terminal 54 of gate 51 is connected to the second input terminal 63 of gate 61.

Figure 2A:
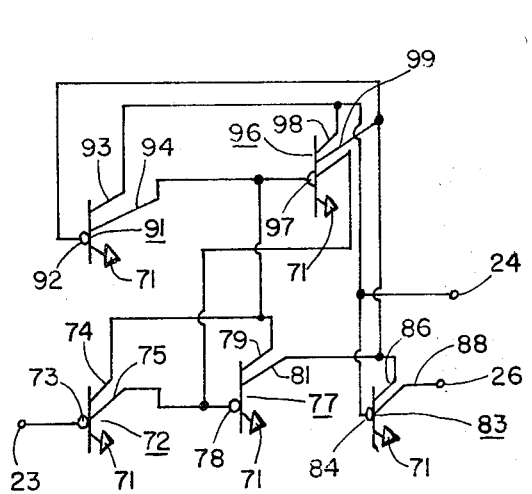
FIG. 2A is a schematic diagram showing the equivalent electrical circuit of a divide-by-two logic circuit shown in block form in FIG. 1.
Figures 2D, 2E:
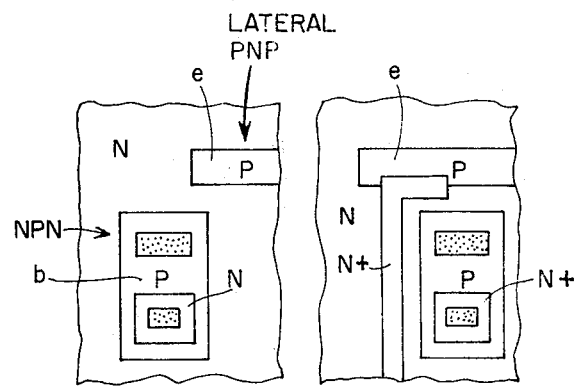
FIGS. 2D and 2E are top views of the planar surface of a semiconductor body showing portions of the physical structure of the present invention.
Figure 2B:
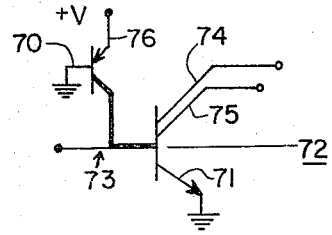
FIG. 2B shows the equivalent circuit of FIG. 2A device.

FIG. 2A is a schematic diagram of divide-by-two logic block 22 and is representative of blocks 28, 34 and 40. Plural devices 72, 77, 83, 91 and 96 are included. Each of the devices may include integrated injection logic or collector-up combinations of device regions, symbolically represented by an open circle at the composite base 73 of device 72, for example, to indicate a source of injected carriers and further an open triangle to represent the composite emitter such as element 71 of device 72. The equivalent circuit of FIG. 2B is illustrative of each of the FIG. 2A devices 72, 77, 83, 91 and 96. The equivalent circuit of FIG. 2B has been previously disclosed in copending patent application Ser. No. 454,789, filed Mar. 26, 1974, entitled "Collector-Up Semiconductor Structure and Method" in the name of Lewis K. Russell and assigned to the present assignee.

In the collector-up semiconductor structure, the bold line shown in FIG. 2B with reference 73 represents a common semiconductor region. Similarly, respective elements 70 and 71 may represent a common region and element 76, shown as the emitter of PNP associated source transistor may be disposed in various configurations so long as the combination of elements 70, 76 and 73 provide sufficient transistor action to inject carriers into region 73 which also serves as the base of NPN transistor. Element 76 may be a corresponding P type semiconductor laterally disposed on a substantially planar surface of a semiconductor body. Moreover as will be seen, region 76 may be of a predetermined geometry to restrict or to "starve" the injection of carriers into certain preselected base regions of devices 72, 77, 83, 91 and 96. Similarly a single source transistor area may provide a common source of carriers for each of the devices 72, 77, 83, 91 and 96. Of course, a two input NOR gate may be simplified from the two base region inputs conventionally required by using one P type base region and utilizing an additional collector region at the output of a divider. A further pullup for a collector output can be implemented by a further P region to the output.

Returning then to FIG. 2A, a single or common semiconductor region such as a single epitaxial layer of N conductivity type may be formed on a semiconductor body and serve as a common layer 71 for each of the respective devices of FIG. 2A. Each of the respective five semiconductor structures shown in FIG. 2A may be formed in the epitaxial layer extending to a substantially planar surface thereof. Five spaced opposite conductivity base regions may be formed in the layer extending to a surface and represented by base regions 73, 78, 84, 92 and 97. The first region 73 is connected to input terminal 23. First and second spaced collector regions are formed in said first base region extending to the surface may be represented by multiple collector elements 74 and 75. The second base region 78 is connected to the second collector region 75 of said first base region.

First and second collector regions are formed in second base region 78 and may be represented by multiple collectors 79 and 81. Collector region 79 is connected to the first collector region 74 of the first base region 73. The third base region 84 is connected to the signal output terminal 24. First and second collector regions 86 and 88 are formed in base region 84 with collector region 88 being connected to the signal complement output terminal 26 and the collector 86 being connected to the second collector 81 of the second base region 78.

The fourth base region 92 is connected to the first collector region 86 of base 84. First and second spaced collector regions 93 and 94 are formed in the fourth base region 92 extending to said surface with the first collector 93 being connected to the signal output terminal 24 and the second collector region 94 being connected to the first collector 79 of said second base region 78.

The fifth base region 97 is connected to the first collector 79 of the second base region 78. First, second and third spaced collector regions 98, 99 and 101 are formed in said fifth base region 97 and extend to the planar surface. The first collector 98 is connected signal output terminal 24 and the second collector 99 is connected to the first collector 86 of the third base region 84. The third collector 101 of base region 97 is connected to the second base region 78. In practice the connection may be implemented by a patterned aluminum layer formed on an insulating layer carried by the planar surface.

Figure 2C:
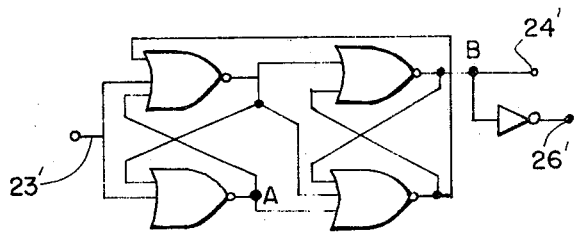
FIG. 2C shows the corresponding symbolic logic diagram of the FIG. 2A circuit.

Referring to FIG. 2C, the symbolic diagram of the FIG. 2A structure is shown. The structure of FIG. 2C represented as cross-coupled latches includes current starved nodes A and B. The current starved nodes are introduced to prevent a signal race condition. FIG. 2D is a top view of a representative current node showing a P type emitter region of a lateral PNP source transistor being spaced laterally away or offset from its P type collector region which also forms the base of the NPN switching device transistor. The emitter is positioned to starve the base region of injected carriers and thereby introduce a predetermined delay time sufficient to prevent a signal race condition. Alternatively a predetermined delay may be provided as in FIG. 2E where an N+ bar may be laterally interposed between the P emitter of the lateral PNP and the base of the NPN. The N+ bar provides an effective offset as in FIG. 2D to cause a corresponding suppression of current injection from the P emitter of the lateral PNP and into the base of the NPN. Of course, in FIGS. 2D and 2E conventional ohmic contacts are provided to each of the respective regions to connect the structure to external circuitry. Both node A and node B may utilize either the FIG. 2D or 2E structure to starve the base of carriers and provide the desired delay.

Figure 3:
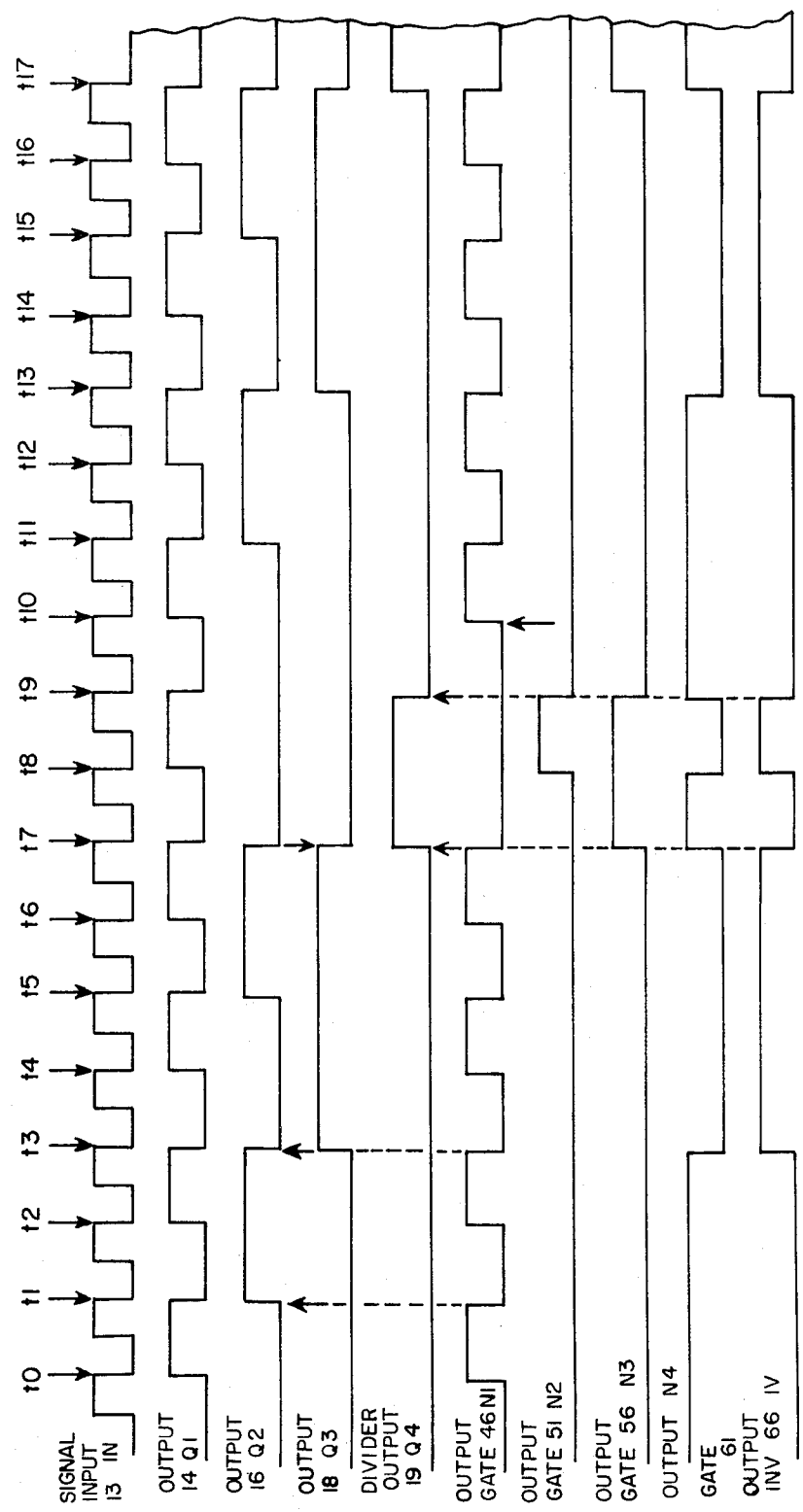
FIG. 3 is a timing diagram showing the sequence of events during operation of the present invention.

The operation of the count of ten divider may be described by referring to the timing diagram of FIG. 3 and the signal paths of FIG. 1. The divide-by-two circuits, 22, 28, 34 and 40 of FIG. 1 are configured to trigger on a negative going pulse edge. Moreover, as will be seen, the gates 46, 51 and 56 and the divide-by-two circuits reset prior to beginning a divide sequence. Thus all zero's are present at the divider outputs at the beginning of a divide sequence. Referring then to FIG. 3, the signal input IN at terminal 13 at $t0$ provides an output signal at Q1 at terminal 14 which does high. With one input of the gate 46 input initially low, input 47 is initially high and the gate output N1 is the same as the signal Q1. At $t0$ N1 goes high due to $\overline{Q1}$ being low. At $t1$, Q1 goes low, N1 goes low and output signal Q2 at terminal 16 goes high. At $t2$, Q1 and N1 go high. At $t3$, Q1 and N1 go low, Q2 goes low and Q3 the output signal at terminal 18 goes high. Simultaneously the gate 61 signal output N4 goes low and the inverter 66 output signal IV goes high. At $t4$, Q1 goes high and N1 the signal output of gate 46 goes high. At $t5$, Q1 goes low, N1 goes low and Q2 goes high. At $t6$, Q1 goes high and N1 goes high. Thus for the first seven pulses the divide-by-two circuits directly count the input signal.

At $t7$, Q1 goes low, N1 goes low, Q2 goes low, Q3 goes low, N4 goes high and IV the signal output of inverter 66 goes low. The divider output signal Q4 goes high and N3 goes high.

For the first seven pulse divider 22 triggers 28 which triggers 34. At the end of the seventh pulse both of the inputs to gate 56 go low, the output signal N3 goes high and thus holds the output of gate 46, N1 low.

N3 going high is a result of Q3 going low at $t7$, driving N4 high and the inverter IV low. The negative going pulse N4 triggers block 40 causing Q4 to go high and $\overline{Q4}$ to go low. With $\overline{Q4}$ low two low inputs are presented at the input to gate 56 causing the output signal N3 to go high and blocking further input signal flow to gate 28.

At $t8$, N2 goes high, N4 low and IV high. At $t9$, the end of the ninth period $\overline{Q1}$ goes high, N2 goes low and both inputs Q3 and N2 are now low at gate 61. As a result N4 goes high, and IV goes low giving a negative going trigger pulse to block 40 with the output Q4 going low and $\overline{Q4}$ going high. The high $\overline{Q4}$ state causes N3 to go low, and gate 46 permits $\overline{Q1}$ to flow therethrough. $\overline{Q1}$ is blocked from flowing through gate 51 by $\overline{Q4}$ now in a high state. At $t10$ the negative going input signal triggers gate 22 and the sequence is repeated.

Thus it is apparent that there has been provided an improved performance, integrated semiconductor divider structure which operates at reduced power levels.

Further, there has been provided an improved semiconductor divider structure having reduced numbers of semiconductor regions and which may be formed in relatively high density arrays. The use of NOR gates is especially useful in providing a dense integrated circuit for a collector up configuration since AND gates would require inverters thus consuming space. In addition, a greatly simplified semiconductor structure capable of performing divide operations has been provided.

What is claimed is:

1. In a count-by-ten divider of the type having an input and an output and utilizing plural divide-by-two circuits, plural NOR gates and an inverter, the divider comprising, first, second, third, and fourth divide-by-two logic circuits each having signal input, signal output and signal complement output terminals, first, second, third and fourth NOR gates having first and second input terminals and an output terminal, an inverter having input and output terminals, said first divide-by-two signal input being connected to said divider input, and said signal complement output being connected to the first input of said first NOR gate and the second input of said second NOR gate, said output of said first NOR gate being connected to the signal input of said second divide-by-two circuit and the signal output of said second divide-by-two circuit being connected to the signal input of the third divide-by-two circuit, said third divide-by-two signal output being connected to the second input of the third NOR gate and the first input of the fourth NOR gate, said output of said fourth NOR gate being connected to the inverter input with the inverter output connected to the signal input of said fourth divide-by-two circuit, said fourth divide-by-two signal complement output being connected to the first input of the third NOR gate and the first input of the second NOR gate, the output of said third NOR gate being connected to the second input of said first NOR gate, and the output of said second NOR gate being connected to the second input to said fourth NOR gate.

2. A divider as in claim 1 where at least some of said logic circuits and NOR gates are implemented in integrated injection logic ($I^2L$) and including current starving means associated with at least one predetermined node of said divider and comprising, an NPN $I^2L$ transistor, a lateral PNP current injection transistor, the emitter of said PNP transistor being effectively offset from the base of said NPN transistor to reduce the amount of injection current.

3. A divider as in claim 2 where two of said nodes include current starving means for introducing delays to prevent a signal race condition.

* * * * *

UNITED STATES PATENT OFFICE
CERTIFICATE OF CORRECTION

Patent No. 3,989,957                    Dated November 2, 1976

Inventor(s)        Patrick A. Tucci

It is certified that error appears in the above-identified patent and that said Letters Patent are hereby corrected as shown below:

Change Inventor: "Patrick A. Tuccu" to --Patrick A. Tucci--.

Signed and Sealed this

Eighteenth Day of April 1978

[SEAL]

Attest:

RUTH C. MASON  
Attesting Officer

LUTRELLE F. PARKER  
Acting Commissioner of Patents and Trademarks